(12) United States Patent
Lee et al.

(10) Patent No.: US 6,831,485 B2
(45) Date of Patent: Dec. 14, 2004

(54) PHASE FREQUENCY DETECTOR WITH A NARROW CONTROL PULSE

(75) Inventors: Chen-Yi Lee, Hsinchu (TW); Pao-Lung Chen, Hsinchu Hsien (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 10/439,545

(22) Filed: May 16, 2003

(65) Prior Publication Data

US 2004/0145390 A1 Jul. 29, 2004

(30) Foreign Application Priority Data

Jan. 23, 2003 (TW) ........................... 92101485 A

(51) Int. Cl.[7] ............................................. G01R 29/00
(52) U.S. Cl. ........................... 327/2; 327/7; 327/42; 327/47; 327/49
(58) Field of Search ........................ 327/2, 3, 7, 8, 327/10, 12, 39, 40, 42, 43, 47, 198–200, 49, 208; 331/25; 324/76.52, 76.54

(56) References Cited

U.S. PATENT DOCUMENTS

| | | | | |
|---|---|---|---|---|
| 4,904,948 | A | * | 2/1990 | Asami .......................... 327/12 |
| 5,142,555 | A | | 8/1992 | Whiteside .................... 375/327 |
| 5,440,274 | A | * | 8/1995 | Bayer .......................... 331/1 A |
| 5,661,419 | A | * | 8/1997 | Bhagwan ........................ 327/8 |
| 5,736,872 | A | * | 4/1998 | Sharma et al. ................ 327/3 |
| 5,812,022 | A | * | 9/1998 | Hirano et al. ................ 327/563 |
| 5,815,041 | A | * | 9/1998 | Lee et al. ..................... 331/8 |
| 5,942,926 | A | * | 8/1999 | Yamaguchi ................. 327/156 |
| 5,977,801 | A | * | 11/1999 | Boerstler ...................... 327/7 |
| 6,037,806 | A | | 3/2000 | Smith et al. .................. 327/47 |
| 6,157,263 | A | | 12/2000 | Lee et al. ..................... 331/25 |
| 6,194,916 | B1 | * | 2/2001 | Nishimura et al. ........... 327/12 |
| 6,208,181 | B1 | * | 3/2001 | Johnson ..................... 327/156 |
| 6,323,692 | B1 | * | 11/2001 | Tsinker ........................ 327/12 |
| 6,369,629 | B1 | | 4/2002 | Sato .......................... 327/203 |
| 6,483,389 | B1 | * | 11/2002 | Lamb .......................... 331/25 |
| 6,642,747 | B1 | * | 11/2003 | Chiu .......................... 327/40 |

OTHER PUBLICATIONS

Robert C. Chang, L.–C. Hsu and M. –C Sun, "A Low–Power and High–Speed D Flip–Flop Using A Single Latch", Journal of Circuits, Systems, and Computers, vol. 11, No. 1, pp. 51–55, 2002.

Sungjoon Kim, Keyongho Lee, Youngsam Moon, Deog–Kyoon Jeong, Yunho Choi, and Hyung Kyu Lim, "A 960–Mb/s/pin Interface for Skew–Tolerant Bus Using Low Jitter PLL", IEEE Journal of Solid–State Circuits, vol. 32, No.5, pp. 691–699, May, 1997.

* cited by examiner

Primary Examiner—Timothy P. Callahan
Assistant Examiner—Hai L. Nguyen
(74) Attorney, Agent, or Firm—Troxell Law Office PLLC

(57) ABSTRACT

A phase frequency detector with a narrow control pulse comprises mainly two substantially equivalent phase latches with a narrow control pulse, and a reset signal generating unit. Each phase latch of a narrow control pulse has a clock pulse input end and a signal output end. Both latches also are connected to the reset signal generating unit. The logic value of each signal output end is decided by which clock pulse input appears first. The reset signal generating unit decides whether or not to generate a reset signal according to the logic values of both signal output ends. The reset signal is then sent to both phase latches of a narrow control pulse, if generated. The present invention can be implemented by a simple circuit. Comparing with the RS NAND PFD or master-slave D PFD, the PFD of the invention has the advantages of faster speed, saving more power and smaller IC chip area. Comparing with dynamic PFD, because the PFD of the invention has a feedback circuit, the storage charges of internal nodes will not be lost due to the leakage current and therefore the working frequency range is wider.

2 Claims, 9 Drawing Sheets

PHASE FREQUENCY DETECTOR WITH A NARROW CONTROL PULSE

FIELD OF THE INVENTION

The present invention general relates to a phase frequency detector (PFD) having narrow control pulses, and more specifically to a PFD by means of phase latches with a narrow control pulse, which can be used in high-speed, low-power and wide working frequency band applications, such as in a high-speed digital phase-locked loop (PLL) circuit and wide band frequency synthesizer.

BACKGROUND OF THE INVENTION

Phase-locked loop is commonly used in various IC chips, such as communication IC, central processing unit (CPU) or networking IC, to achieve synchronous clock signal. In general, a phase-locked loop comprises mainly a PFD, a charge pump, a voltage controlled oscillator (VCO), and a loop filter. The PFD is used mainly to detect the difference between phase and frequency.

FIG. 1 shows a conventional tri-state PFD. Referring to FIG. 1, the PFD provides a reference signal REF as an input clock pulse, and a phase difference control signal VCO between two clock pulses in a voltage controlled oscillator. It also comprises two flip-flops 101 and 103, and an added AND gate. D terminals of both flip-flops are connected to VDD. The CLK terminal of flip-flop 101 is connected to REF. The added AND gate is an asynchronous mechanism. Flip-flops in FIG. 1 can be realized by master-slave D flip-flops, RS NAND latches or dynamic latches. FIGS. 2a-2c show three embodiments of the PFD in FIG. 1, which are master-slave D PFD, RS NAND PFD and dynamic PFD, respectively.

In FIG. 2a, the PFD uses master-slave D flip-flops of positive edge-triggered with a reset input signal Reset. Its input terminal D is connected to VDD and the CLK terminal is connected to REF.

In FIG. 2b, the PFD is realized by RS NAND latches. That is, the PFD is composed of two crossed-coupled RS NAND latches. The first latch, labeled latch_1, consists of NAND A1 and NAND B1. The second latch, labeled latch_2, consists of NAND A2 and NAND B2. latch_1 and latch_2 respond to the falling edges of the input reference signal and the reset signal, respectively. This kind of RS NAND latch using NAND gates is asynchronous and may suffer from its internal state transitions. It takes longer delay in response to the input reference signal and in generating the reset signal. Therefore, it is not suitable for high-speed and low-power PFDs.

The PFD shown in FIG. 2c is a PFD using dynamic latches that is disclosed in U.S. Pat. No. 6,157,263. It uses internal nodes to memorize the running states of the PFD. The stored charge in the internal nodes may suffer from the leakage current that is caused by unsuitable wide frequency band.

As the clock rate of the input reference signal in a PFD increases, the phase-locked loop requires higher quality. There are two major reasons causing a high-quality phase-locked loop un stable. One is that added noises may accidentally change the frequency of the voltage controlled oscillator and therefore, cause the output clock pulse of the phase-lock loop unstable. The other is that the instability is caused by a low-precision PFD. Conventional PFDs have a big minimal detectable phase difference, called dead zone, that may cause the PFD unstable. Conventional PFDs with static logic gates may cause speed limitation due to the propagation delay among the logic gates. The speed limitation broadens the dead zone under high sped running. Consequently, the instability of the PFD is increased.

SUMMARY OF THE INVENTION

The present invention has been made to overcome the above-mentioned drawback of conventional PFDs. An object of the present invention is to provide a PFD with a narrow control pulse by using a static circuit. The PFD comprises mainly two substantially equivalent phase latches of a narrow control pulse, and a reset signal generating unit.

According to the present invention, each phase latch with a narrow control pulse has a clock pulse input end and a signal output end. Both latches are also connected to the reset signal generation unit. The logic value of each signal output end is determined by which clock pulse input appears first. The reset signal generating unit decides whether or not to generate a reset signal according to the logic values of both signal output ends. The reset signal is then sent to both phase latches with a narrow control pulse if the signal is generated.

Each phase latch with a narrow control pulse comprises a narrow control pulse generating unit, a path unit, a feedback switch, a storage reset unit, and a feedback output unit. The resulting logic value of each signal output end is not affected by the use of positive or negative edge-triggered.

There are three kinds of equivalent circuitry for the preferred embodiment of the phase latch with a narrow control pulse of this invention. The design of the equivalent circuitry has two major objectives. One is to reduce the gate count used in conventional master-slave D flip-flops with reset operation. The other is to shorten the setup time of the phase latch with a narrow control pulse.

The gate count used in the phase latch with a narrow control pulse of the invention is about half of the conventional master-slave D flip-flops with reset operation. The present invention also uses a narrow control pulse and feedback control mechanism to shorten the setup time of the phase latch with a narrow control pulse. Because of the feedback control mechanism, the speed of the phase frequency detector of the invention is faster than that of a conventional dynamic PFD.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

Figure 3:
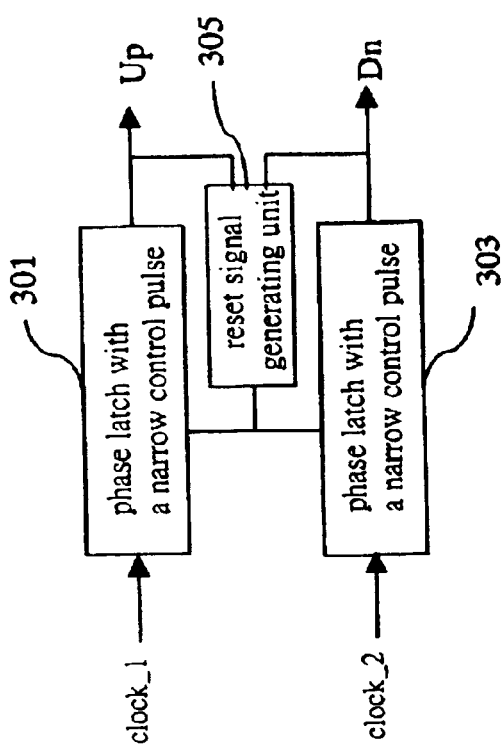
FIG. 3 is a schematic diagram of a PFD with a narrow control pulse according to the present invention.

FIG. 3 is a schematic diagram of a PFD with a narrow control pulse according to the present invention. Referring to FIG. 3, the PFD comprises two substantially equivalent phase latches 301 and 303 with a narrow control pulse, and a reset signal generating unit 305. The phase latches 301 and 303 with a narrow control pulse have respectively a clock pulse input end and a signal output end. Both latches also are connected to the reset signal generating unit 305. The clock pulse input end of the phase latch 301 with a narrow control pulse is referred to as clock_1 and the signal output end is referred to as Up. The clock pulse input end of the phase latch 303 with a narrow control pulse is referred to as clock_2 and the signal output end is referred to as Dn. The logic value of each signal output end is determined by the order of the appearance of both clock pulse inputs clock_1 and clock_2. The reset signal generating unit 305 decides whether to generate a reset signal according to the logic values of both signal output ends. The reset signal is then sent to the phase latches 301 and 303 with a narrow control pulse, if the signal is generated.

Figure 4:
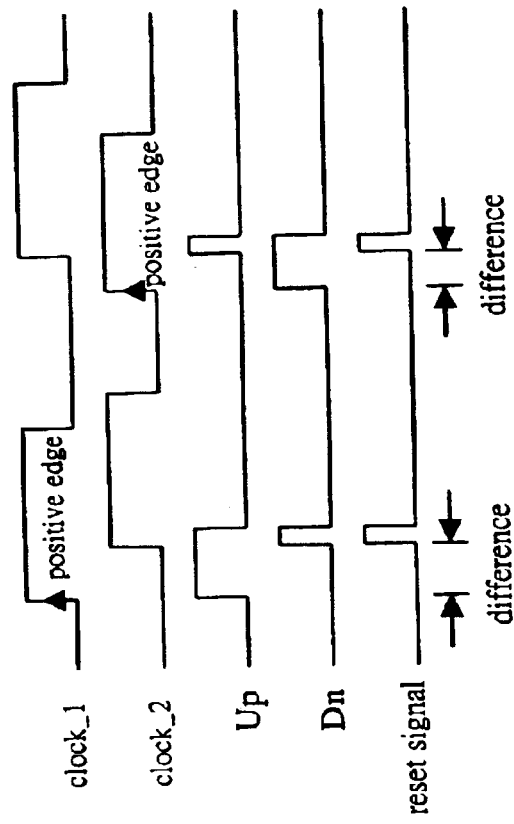
FIG. 4 is a timing diagram depicting the operational characteristics of FIG. 3, in which positive edge-triggered is used.

FIG. 4 is a timing diagram depicting the operational characteristics of FIG. 3, in which positive edge-triggered is used. Referring to FIG. 4, when the clock_1 leads clock_2, the logic value of the signal output end Up of the phase latch 301 with a narrow control pulse becomes logic 1. On the other hand, when the clock_2 leads clock_1, the logic value of the signal output end Dn of the phase latch 303 with a narrow control pulse becomes logic 1. When both logic values of the signal output ends are logic 1s, the reset signal generating unit 305 generates a reset signal and sends the reset signal to the phase latches 301 and 303 with a narrow control pulse.

According to the present invention, the resulting logic value of each signal output end is not affected by the use of positive or negative edge-triggered.

Figure 5:
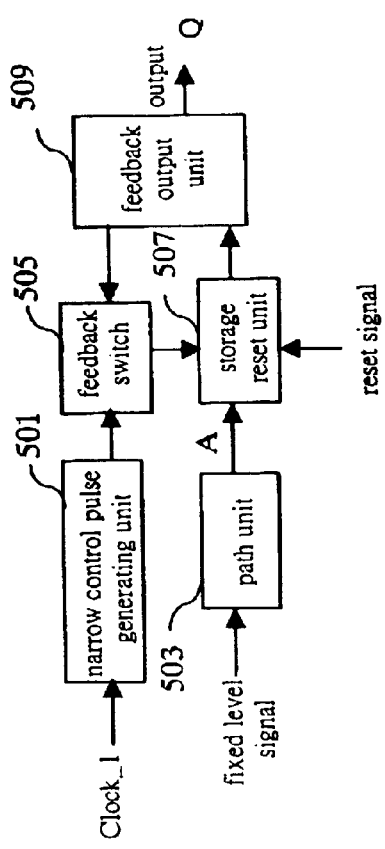
FIG. 5 is a block diagram of a phase latch with a narrow control pulse according to the present invention.

FIG. 5 is a block diagram of a phase latch with a narrow control pulse according to the present invention. Referring to FIG. 5, each phase latch with a narrow control pulse comprises a narrow control pulse generating unit 501, a path unit 503, a feedback switch 505, a storage reset unit 507, and a feedback output unit 509. The path unit 503 has an input end of a fixed level signal.

According to the present invention, when the fixed level signal is logic 1, i.e. connected to VDD, the path unit 503 is realized by a P-MOS and the feedback switch 505 is realized by an N-MOS. The narrow control pulse generating unit 501 generates a low voltage-level narrow control pulse. The low voltage-level narrow control pulse controls the path unit 503 to send the fixed level signal to the node labeled A. Also, this low voltage-level narrow control pulse is used simultaneously to close the feedback switch 505 to let the fixed level signal enter into the storage reset unit 507. If the reset signal is not enabled, then the fixed level signal is further sent to the feedback output unit 509.

When the fixed level signal is logic 0, i.e. connected to the ground GND, the path unit 503 is realized by an N-MOS and the feedback switch 505 is realized by a P-MOS. The narrow control pulse generating unit 501 generates a high voltage-level narrow control pulse. The high voltage-level narrow control pulse controls the path unit 503 and the feedback switch 505 to send the fixed level signal to the node A. The signal at node A is GND. Also, this high voltage-level narrow control pulse is used simultaneously to close the feedback switch 505 to let the fixed level signal enter into the storage reset unit 507. As mentioned above, if the reset signal is not enabled, then the fixed level signal is further sent to the feedback output unit 509.

Figure 6:
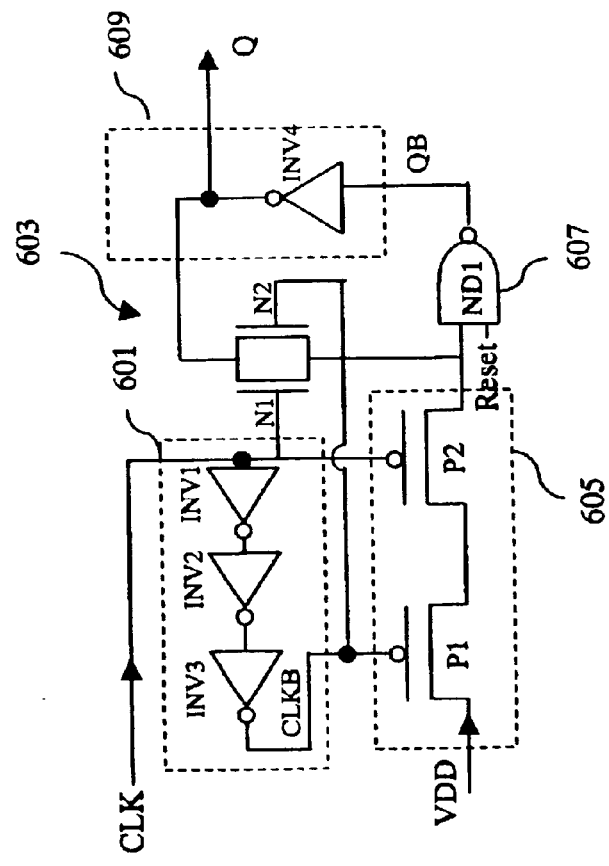
FIG. 6 is a circuit diagram that realizes the phase latch with a narrow control pulse of FIG. 5, in which negative edge-triggered is used.

FIG. 6 is a circuit diagram that realizes the phase latch with a narrow control pulse of FIG. 5, in which negative edge-triggered is used. Referring to FIG. 6, the phase latch with a narrow control pulse comprises four inverters INCA~INV4, two P-MOS, two N-MOS and a NAND gate ND1. In this preferred embodiment, the narrow control pulse generating unit 601 is realized by three inverters to generate an inverted delay clock signal CLKB. When the input clock signal CLK and the inverted delay clock signal CLKB are both at low voltage-level, a low voltage-level narrow control pulse is generated. The feedback switch 603 is realized by two N-MOS. The path switching unit 605 is realized by two P-MOS. The storage reset unit 607 is realized by a NAND gate. The feedback output unit 609 is realized by an inverter.

The operating principle of this embodiment is as follows. When the clock signal CLK at the input end and the inverted delay clock signal CLKB are both at low voltage-level, a low voltage-level narrow control pulse is generated to control two P-MOS and two N-MOS, and let the fixed level signal enter the node A. If the reset signal is not enabled, then the fixed level signal is sent to the node Q. The low voltage-level narrow control pulse simultaneously closes the feedback switch. When the pulse goes out, the feedback control keeps going and the signal at node A is stable, unlike the dynamic latch having current leakage problem and causing the signal at node A to vanish. If the reset signal is enabled, then the signal at node A is not working. Therefore, the value at node Q is cleared. The following will give more detailed description with reference to FIG. 6 and FIG. 7.

Figure 7:
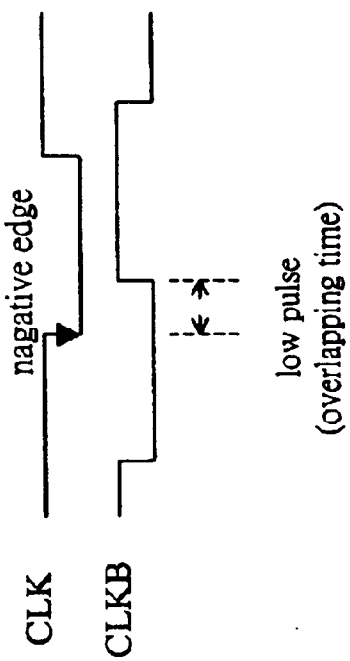
FIG. 7 shows the overlapping time $T_{setup}$ of the circuit diagram of FIG. 6.

As shown in FIG. 6, three inverters INV1~INV3 are connected in series to generate an inverted delay clock signal CLKB. FIG. 7 illustrates the overlapping time $T_{setup}$ of the circuit diagram shown in FIG. 6. As shown in FIG. 7, CLKB is an inverted delay clock signal of the input clock signal CLK. When both CLK and CLKB signals are at low level, two P-MOS P1 and P2 are opened and two N-MOS N1 and N2 are closed. The clock signal CLK uses three inverters INV1~INV3 to generate the inverted delay clock signal CLKB. CLK and CLKB signals are used to generate the overlapping time $T_{setup}$ that opens P1 and P2 at the same time. It is worthy to mention that the overlapping time is the setup time of the phase latch with a narrow control pulse according to the invention. The source terminal of P1 is connected to logic 1, that is, VDD. The gate terminal of P1 is controlled by CLKB and the gate terminal of P2 is controlled by CLK.

Using the overlapping time $T_{setup}$, logic 1 can pass P1 and P2 and then enters the node A, that is, logic 1 of the input terminal of the NAND gate. Within the period of the overlapping time $T_{setup}$, N1 and N2 are closed. When the other end of the NAND gate is logic 1, the NAND gate works like an inverter. Therefore, signal logic 1 is output to node Q via another inverter INV4. After the period of the overlapping time $T_{setup}$, N1 and N2 are opened. According to this, a positive feedback mechanism is formed and the current leakage problem at dynamic latches is resolved. Comparing with the conventional single latch D flop-flop, the present invention has neither the problem of the threshold voltage drop at node A.

In the preferred embodiment, the PFD with a narrow control pulse provides a reset function in the phase latch with a narrow control pulse according to the present invention. Instead of using an inverter, the reset operation uses a NAND gate. If the reset signal is logic 0, the output signal Q will be pulled down to logic 0.

The following analyzes the speed and the setup time of the phase latch with a narrow control pulse of the present invention, and compares with the setup time of the conventional PFD composed of master-slave D flip-flops.

Figure 2A:
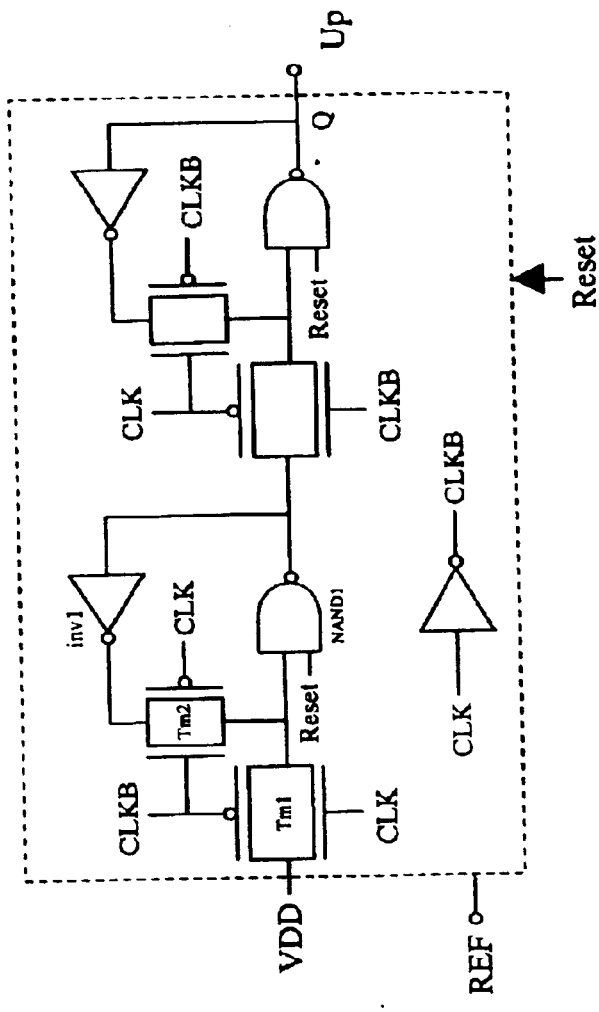
FIG. 2a is a PFD of FIG. 1 composed of master-slave D flip-flops.
Figure 1:
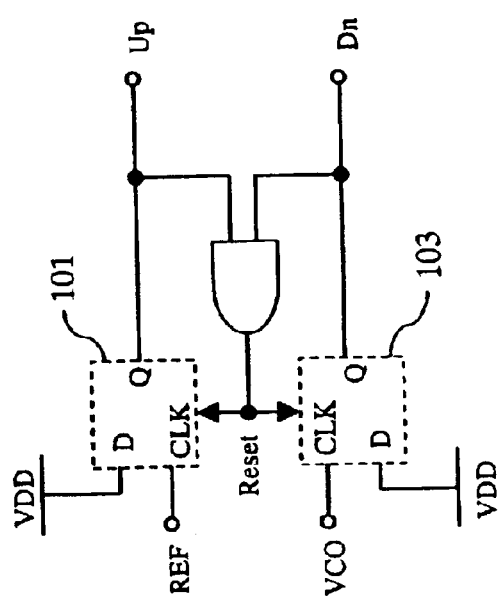
FIG. 1 is a conventional tri-state PFD.
Figures 2B, 2C:
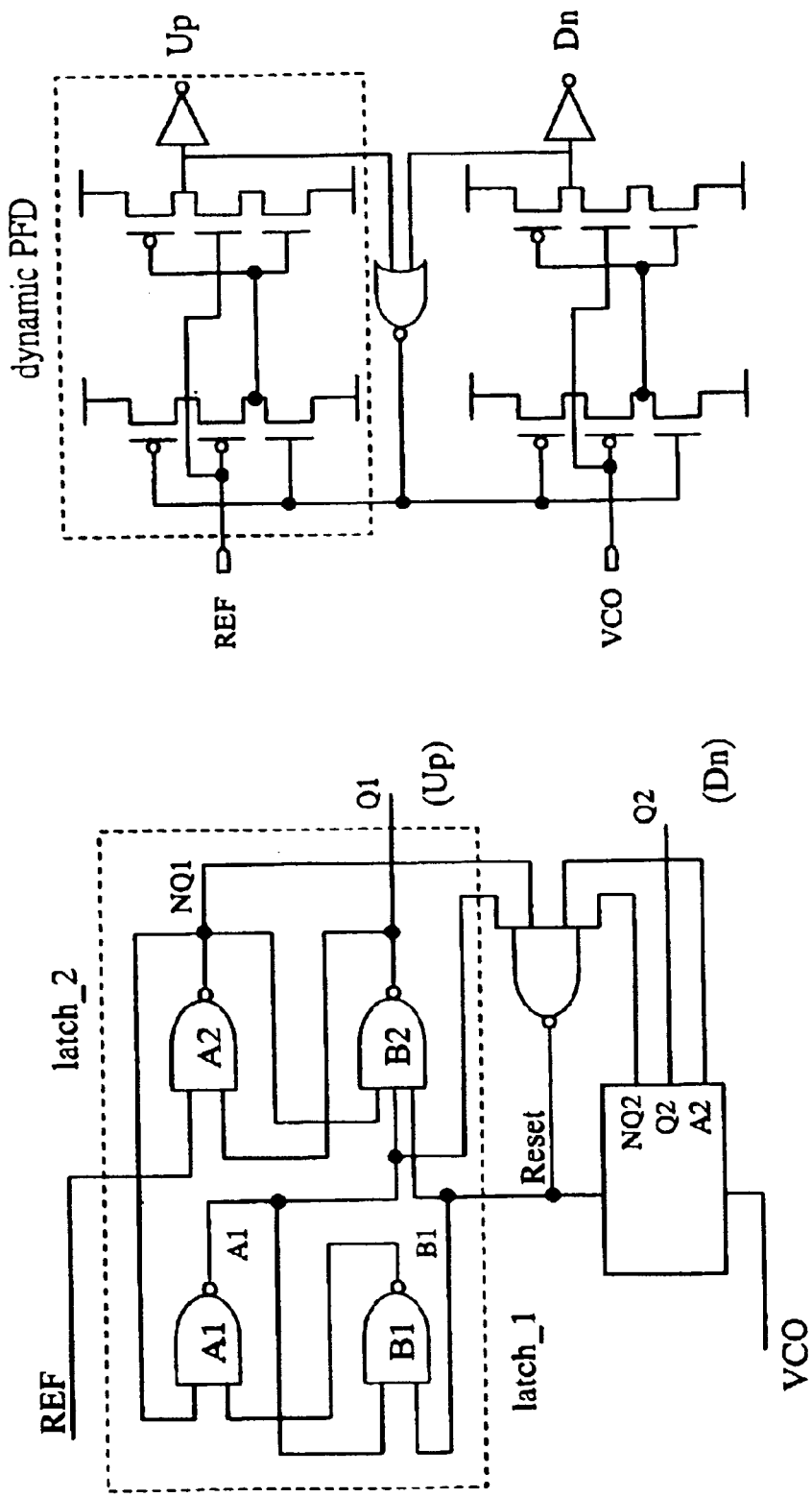
FIG. 2b is a PFD of FIG. 1 composed of RS NAND latches.
FIG. 2c is a PFD of FIG. 1 composed of dynamic latches.

Referring to FIG. 2a, the setup time for the conventional PFD composed of master-slave D flop-flops is as follows:

$$T_{MS\text{-}setup}=T_{Tm1}+T_{NAND1}+T_{inv1}+T_{Tm2}+T_{fight} \quad (1)$$

where parameters $T_{Tm1}$, $T_{NAND1}$, $T_{inv1}$, and $T_{Tm2}$ denote respectively the delay times of the transmission gate Tm1, the NAND gate ND1, the inverter INV1 and the transmission gate Tm2, $T_{FIGht}$ is the fighting time when the previous stored data is different from the new data.

After comparison with the conventional PFD, the setup time for the phase latch with a narrow control pulse in the preferred embodiment of FIG. 6 of the invention is:

$$T_{setup}=2\sim 3\ T_{inv1} \quad (2)$$

where $T_{inv1}$ denotes the delay time of the inverter INV1.

Comparing the setup times in Eq. (1) and Eq. (2), the PFD with a narrow control pulse of the invention is faster than a conventional PFD composed of master-slave D flip-flops.

In the embodiment mentioned above, the PFD with a narrow control pulse of the invention comprises two phase latches of the narrow control pulse and a NAND gate. The dock input terminals of these two phase latches are connected respectively to REF and VCO. When REF is switched from logic 1 to logic 0, logic 1 is latched into the phase latch of the narrow control pulse before signal Up is pulled up (logic 1). When both Up and Dn signals are logic 0, a reset signal is generated to clear the status of the PFD. When the reset signal is enabled, both Up and Dn signals are logic 0.

Therefore, the setup time of the phase latch with a narrow control pulse of the invention is as short as a high-speed dynamic circuit. Because the present invention shortens the setup time of the phase latch with a narrow control pulse and uses positive feedback loop to speed up the data latched-in, the speed of the PFD of the invention is faster than that of a conventional PFD composed of dynamic latches or other conventional PFDS.

Figure 8:
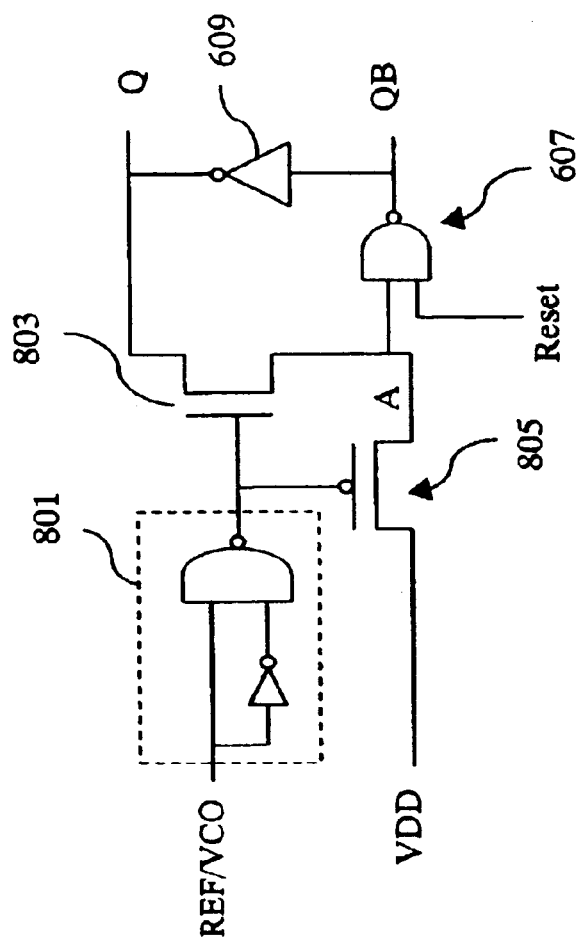
FIG. 8 is another circuit diagram of the phase latch with a narrow control pulse of FIG. 5, in which a fixed level signal is tied to logic 1.
Figure 9:
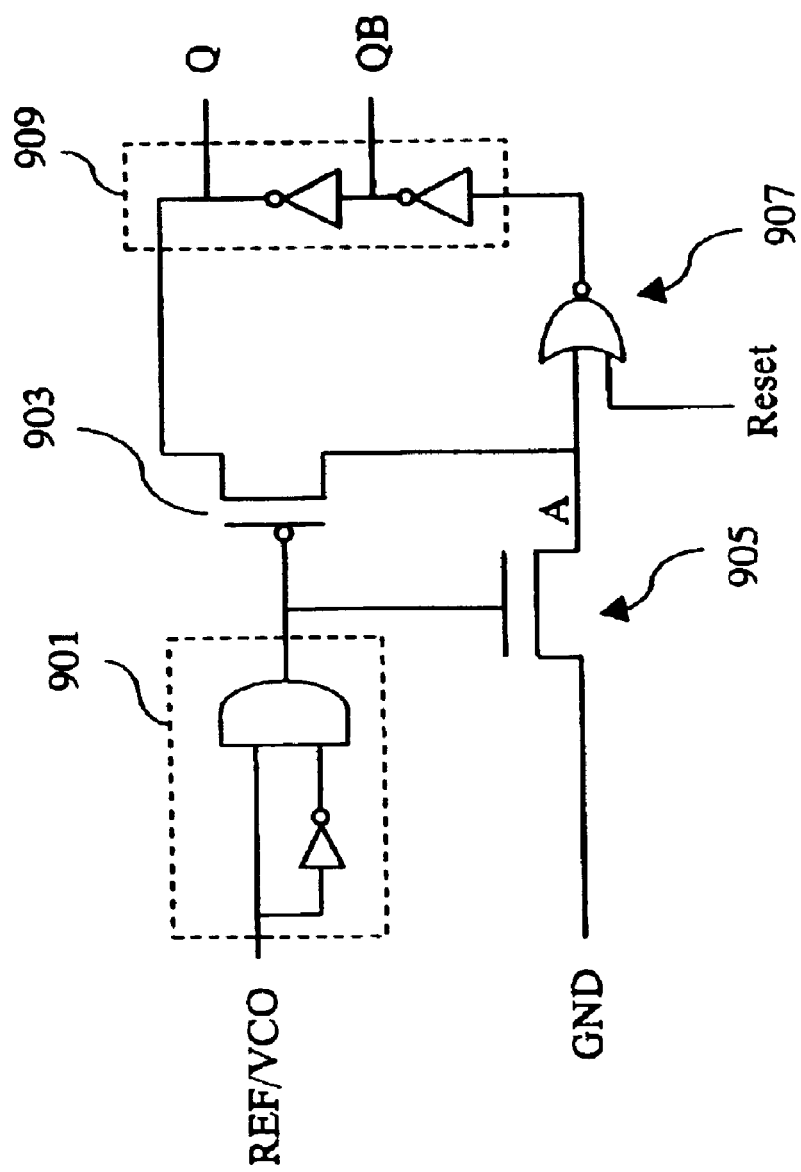
FIG. 9 is another circuit diagram of the phase latch with a narrow control pulse of FIG. 5, in which a fixed level signal is tied to logic 0.

In addition to the circuit shown in FIG. 6, the phase latch with a narrow control pulse of the invention can be implemented by more simple circuitry. FIG. 8 and FIG. 9 below show two simple circuit diagrams for a phase latch with a narrow control pulse of the invention, in which a fixed level is tied to logic 1 and logic 0, respectively.

FIG. 8 shows a circuit diagram for the phase latch with a narrow control pulse of the invention shown in FIG. 5, in which a fixed level signal is tied to logic 1. Referring to FIG. 8, the narrow control pulse generating unit 801 is realized by a NAND gate and an inverter, the feedback switch 803 is realized by an N-MOS, the path switching unit 805 is realized by a P-MOS, the storage reset unit 607 is realized by a NAND gate, and the feedback output unit 609 is realized by an inverter.

When the narrow control pulse generating unit 801 generates a narrow control pulse with a low voltage-level, a fixed level signal enters into node A and operates with the reset signal. When the fixed level signal is logic 1, the reset signal is enabled. The reset signal generating unit uses a NAND gate if Q output is chosen. Otherwise, the reset signal generating unit uses an OR gate if QB output is chosen.

FIG. 9 shows another circuit diagram for the phase latch with a narrow control pulse of the invention shown in FIG. 5, in which a fixed level signal is tied to logic 0. Referring to FIG. 9, the narrow control pulse generating unit 901 is realized by an AND gate and an inverter, the feedback switch 903 is realized by a P-MOS, the path switching unit 905 is realized by an N-MOS, the storage reset unit 907 is realized by a NAND gate, and the feedback output unit 909 is realized by two inverters.

When the narrow control pulse generating unit 901 generates a narrow control pulse with a high voltage-level, a fixed level signal enters into node A and operates with the reset signal. When the fixed level signal is logic 0, the reset signal is not enabled. The reset signal generating unit uses an AND gate if Q output is chosen. Otherwise, the reset signal generating unit uses a NOR gate if QB output is chosen.

Figure 10:
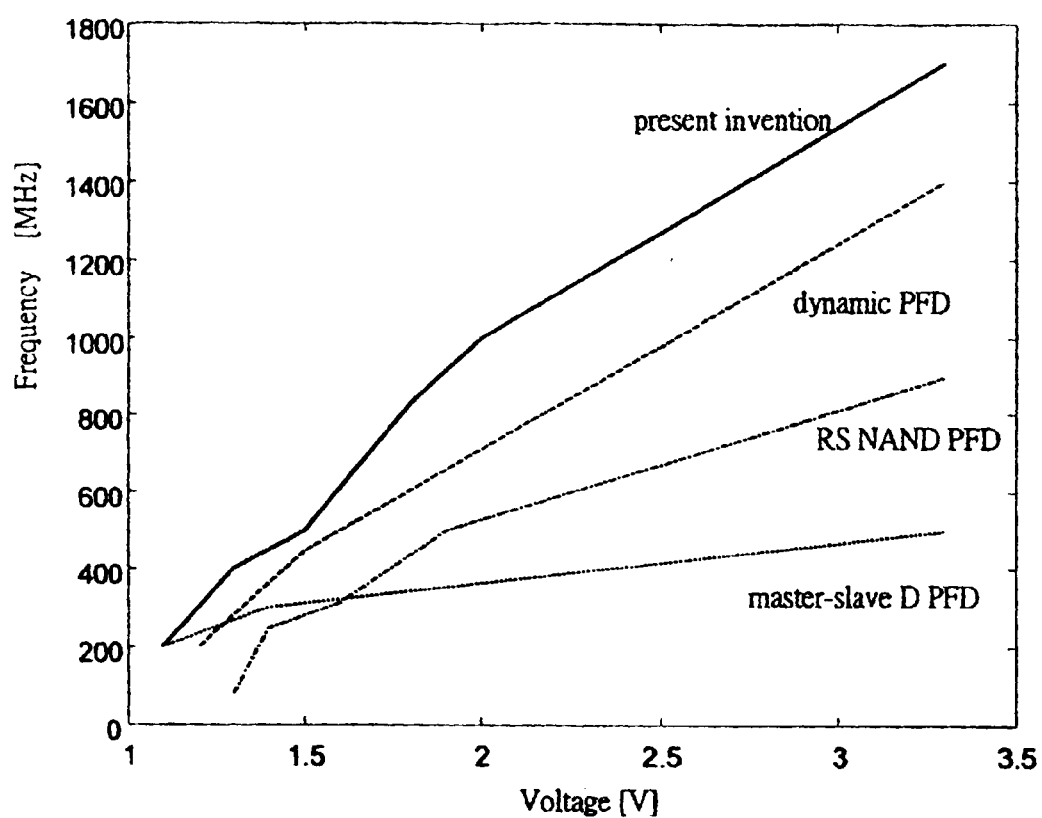
FIG. 10 shows the maximal operating frequency for the PFD of the present invention, master-slave D PFD, RS NAND PFD and dynamic PFD.

The advantages of the PFD of the present invention can be illustrated by FIGS. 10-12 in the following. FIG. 10 shows the maximal operating frequency for the PFD of the present invention, master-slave D PFD, RS NAND PFD and dynamic PFD, where the horizontal axis represents the applied voltage in volts unit and the vertical axis represents the maximal operating frequency of respective PFD. Referring to FIG. 10, the solid line shows the maximal operating frequency of the PFD of the present invention. Long dashed line shows the maximal operating frequency of the dynamic PFD. Short dashed line shows the maximal operating frequency of the RS NAND PFD. Dotted line shows the maximal operating frequency of the master-slave D PFD. As shown in FIG. 10, the PFD of the present invention operates fastest while the master-slave D PFD operates slowest among these PFDs.

Figure 11:
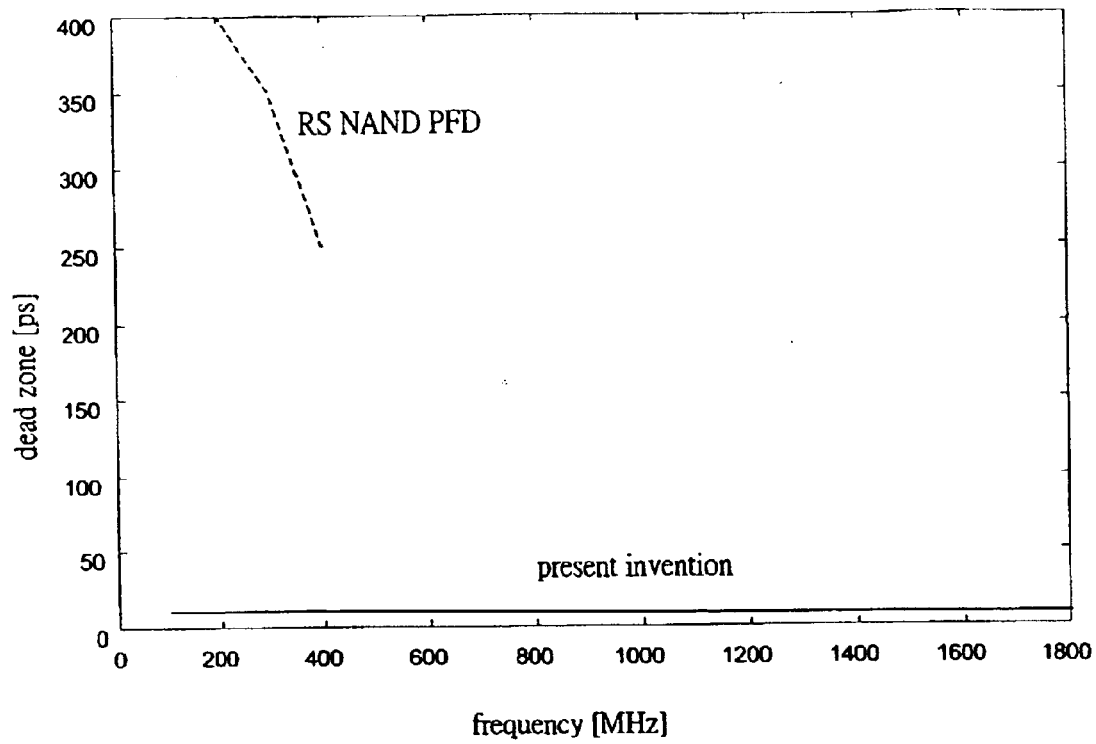
FIG. 11 shows the dead zone of the PFD of the present invention and RS NAND PFD.

FIG. 11 illustrates the dead zone of the PFD of the present invention and the RS NAND PFD, where the horizontal axis represents the frequency and the vertical axis represents the dead zone. Referring to FIG. 11, the solid line shows the dead zone of the PFD of the present invention. Long dashed line shows the dead zone of the conventional RS NAND PFD. As shown in FIG. 11, the dead zone of the PFD of the present invention is less than 10 ps ($10^{-12}$ seconds) while the dead zone of the conventional RS NAND PFD is at least 200 ps.

Figure 12:
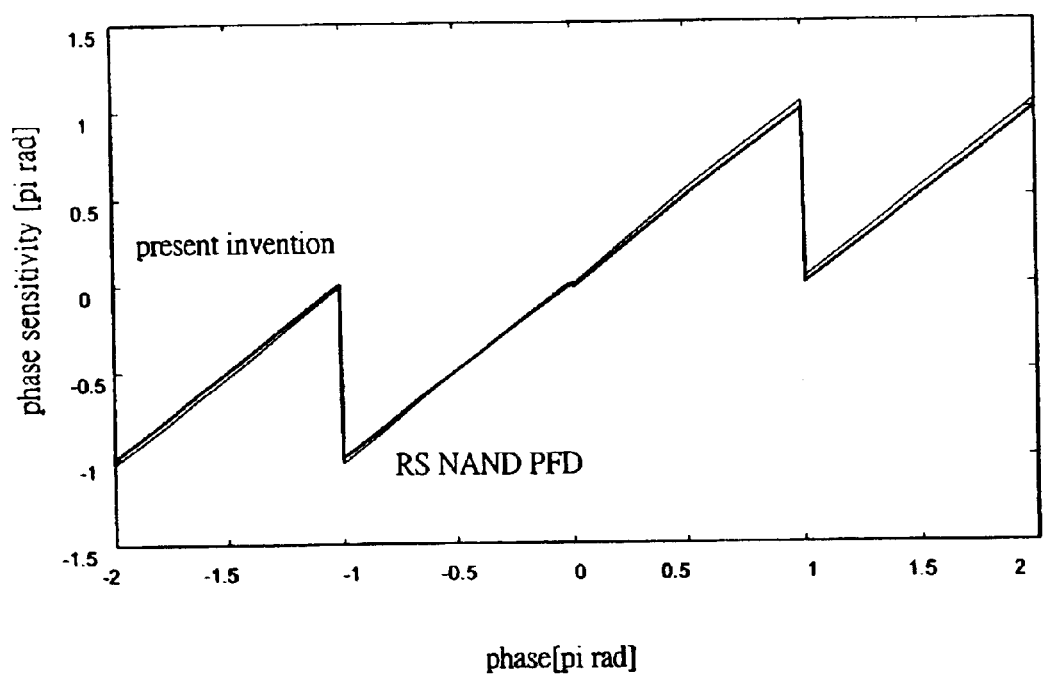
FIG. 12 shows the phase characteristics of the PFD of the present invention and RS NAND PFD.

FIG. 12 illustrates the phase characteristics of the PHD of the present invention and the RS NAND PFD, where VDD is 3.3 volts, the working frequency is 200 MHz, the horizontal axis represents the phase and the vertical axis represents the phase sensitivity, in angular velocity unit. Referring to FIG. 12, the solid line shows the phase characteristics of the PFD of the present invention. Dashed line shows the phase sensitivity of the conventional RS NAND PFD. As shown in FIG. 12, the phase sensitivity of the PFD of the present invention has better linearity than that of the conventional RS NAND PFD.

As conclusion, the present invention can be implemented by a simple circuit. Comparing with the RS NAND PFD or master-slave D PFD, the PFD of the present invention has the advantages of faster speed, saving more power and smaller IC chip area. Comparing with the dynamic PFD, because the PFD of the present invention has a feedback circuit, the storage charges of internal nodes will not be lost due to the leakage current and therefore the working frequency range is wider.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A phase frequency detector with a narrow control pulse, comprising:

two substantially equivalent phase latches of a narrow control pulse, each phase latch having a clock pulse input end and a signal output end; and a reset signal generating unit being connected to said phase latches, said reset signal generating unit deciding whether or not to generate a reset signal according to the logic values of said signal output ends and sending said reset signal to said phase latches;

wherein each phase latch further comprises:

a first inverter for inverting clock signals from said clock pulse input;

a first NAND gate receiving clock signals from said clock pulse input and the inverted clock signals from said first inverter for generating voltage-level narrow control pulses;

a P-MOS having a first end of fixed level signal of logic 1, a second end and a gate receiving said voltage-level narrow control pulses;

an N-MOS having a first end connected to the second end of said P-MOS, a second end and a gate receiving said voltage-level narrow control pulses;

a second NAND gate having a first end connected to the second end of said P-MOS, a second end connected to said reset signal, and an output; and a second inverter having an input connected to the output of said second NAND gate and on output connected to the second end of said N-MOS.

2. A phase frequency detector with a narrow control pulse, comprising:

two substantially equivalent phase latches of a narrow control pulse, each phase latch having a clock pulse input end and a signal output end; and a reset signal generating unit being connected to said phase latches, said reset signal generating unit deciding whether or not to generate a reset signal according to the logic values of said signal output ends and sending said reset signal to said phase latches;

wherein each phase latch further comprises:

a first inverter for inverting clock signals from said clock pulse input;

an AND gate receiving clock signals from said clock pulse input and the inverted clock signals from said first inverter for generating voltage-level narrow control pulses;

an N-MOS having a first end of fixed level signal of logic 0, a second end and a gate receiving said voltage-level narrow control pulses;

a P-MOS having a first end connected to the second end of said N-MOS, a second end and a gate receiving said voltage-level narrow control pulses;

a NOR gate having a first end connected to the second end of said N-MOS, a second end connected to said reset signal, and an output;

a second inverter having an input connected to the output of said NOR gate and an output; and a third inverter having an input connected to the output of said second inverter and an output connected to the second end of said P-MOS.

* * * * *